(12) United States Patent
Ravish et al.

(10) Patent No.: US 7,369,917 B2
(45) Date of Patent: May 6, 2008

(54) SYSTEM AND METHOD FOR AUTOMATIC SORTING OF ELEMENTS IN DRAWING SPECIFICATIONS FOR EFFICIENT TRACING USING MOTION CONTROL

(75) Inventors: Sushrutha Ravish, Karnataka (IN); Praveen Shivananda, Karnataka (IN); Sundeep Chandhoke, Austin, TX (US); Mahesh Ramchandani, Round Rock, TX (US)

(73) Assignee: National Instruments Corporation, Austin, TX (US)

( * ) Notice: Subject to any disclaimer, the term of this patent is extended or adjusted under 35 U.S.C. 154(b) by 157 days.

(21) Appl. No.: 11/334,782

(22) Filed: Jan. 17, 2006

(65) Prior Publication Data

US 2007/0168078 A1    Jul. 19, 2007

(51) Int. Cl.
*G06F 19/00* (2006.01)
(52) U.S. Cl. .......................... 700/186; 700/86; 700/87; 700/182; 700/187
(58) Field of Classification Search ............... 700/186, 700/187, 182, 180, 86, 87
See application file for complete search history.

(56) References Cited

U.S. PATENT DOCUMENTS

| | | | |
|---|---|---|---|
| 5,426,722 A | 6/1995 | Batchelder | |
| 5,579,454 A | 11/1996 | Billyard et al. | |
| 5,929,865 A | 7/1999 | Balz et al. | |
| 6,112,133 A * | 8/2000 | Fishman | 700/182 |
| 6,552,290 B1 | 4/2003 | Lawandy | |
| 7,076,322 B2 | 7/2006 | Chandhoke | |
| 7,139,843 B1 * | 11/2006 | Brown et al. | 709/246 |
| 2001/0000805 A1 * | 5/2001 | Kadono | 700/182 |
| 2005/0137726 A1 * | 6/2005 | Kuhnert | 700/86 |
| 2005/0228534 A1 * | 10/2005 | Shibano | 700/182 |
| 2006/0106486 A1 * | 5/2006 | Tanaka et al. | 700/186 |
| 2007/0179644 A1 * | 8/2007 | Ravish et al. | 700/83 |

* cited by examiner

*Primary Examiner*—Leo Picard
*Assistant Examiner*—Steven R. Garland
(74) *Attorney, Agent, or Firm*—Meyertons Hood Kivlin Kowert & Goetzel, P.C.; Jeffrey C. Hood; Mark S. Williams (57) ABSTRACT

System and method for utilizing a drawing specification for motion control. A plurality of elements in a drawing specification may be automatically identified. The elements may include one or more lines, polygons, arcs, splines, alphanumeric characters, and/or ellipses. Additionally, the drawing specification may be a drawing or digital drafting file, e.g., an AutoCAD file, among others. An order of the plurality of elements may be automatically determined according to a sorting algorithm. The sorting algorithm may include a geometric and/or radial sorting algorithm. The radial sorting algorithm may specify the order of the elements according to nesting, e.g., nesting order and depth, and/or distance from the center of the drawing specification. Code may be automatically generated for implementing motion control based on the identified elements and the determined order. The generated code may include inserted operations such as raise, lower, and move operations, among others.

41 Claims, 8 Drawing Sheets

SYSTEM AND METHOD FOR AUTOMATIC SORTING OF ELEMENTS IN DRAWING SPECIFICATIONS FOR EFFICIENT TRACING USING MOTION CONTROL

FIELD OF THE INVENTION

The present invention relates to the field of motion control, and more particularly to a system and method for utilizing drawing specifications for motion control.

DESCRIPTION OF THE RELATED ART

Drawing specifications often describe or specify the desired behavior or product(s) of various systems, e.g., motion control systems. For example, architects may draw or draft specifications that specify a desired product and may be crafted from a raw material, e.g., the desired shape or design required from, for example, a piece of wood. Similarly, electrical engineers may draw a detailed electrical circuit that may be etched on a silicon wafer.

In recent years, various systems and methods have attempted to generate motion control from the drawing specifications. Some software systems allow the user to specify motion control steps during the drafting of the drawing specification, e.g., by manually inserting motion control operation specifications in the drawing specifications, i.e., via a computer; however, this can be tedious and hard to understand, and in many cases, may become overly complex.

Thus, improved systems and methods for utilizing drawing specifications for motion control are desirable.

SUMMARY OF THE INVENTION

Various embodiments of a system and method for utilizing drawings for motion control are presented.

The method may include automatically identifying a plurality of elements in a drawing specification (possibly comprising multiple drawing specifications. Additionally, the drawing specification may include or be included in one or more digital files, e.g., one or more AutoCAD digital drafting files. The file may be present on a computer system or may be accessed or downloaded from another computer system via a suitable network. The drawing specification may also include one or more drawings. In some embodiments, an image acquisition device, e.g., a scanner, a digital camera, or other appropriate acquisition device(s), may obtain an image of the drawing(s), which in turn may be analyzed on or by the computer system.

In preferred embodiments, the plurality of elements of the drawing specification may be automatically identified by a program executing on the computer system. In some embodiments, the program executing on the computer system may include one or more text-based programs and/or one or more graphical programs, such as, for example, those implemented in or by the LabVIEW graphical program development environment provided by National Instruments Corporation. Additionally, the program may include a graphical user interface (GUI) executing on the computer system or the other computer system. The user may also specify one or more constraints on one or more of the elements included in the drawing specification. For example, the user may specify the placement or order of one or more of the elements, e.g., the user may specify that a certain element be placed first in the order, as described in more detail below.

In some embodiments, the elements may include any of numerous shapes and lines specified or included in the drawing specification. For example, the drawing specification may include one or more lines, polygons, arcs, splines, alphanumeric characters with one or more associated fonts, ellipses, and/or clouds, among others. Note that embodiments where the drawing specification includes one or more AutoCAD digital drafting files, the elements may include entities found in a DXF file (e.g., the AutoCAD digital drafting file), although other drafting file formats are also contemplated.

In some embodiments, elements may be nested, i.e., located within one or more other elements in the drawing specification. Each of these elements, and combinations thereof, may be automatically identified, e.g., via the program executing on the computer system. In some embodiments, complex elements may include one or more elements in the drawing specification and may be automatically identified. In some embodiments, as indicated above, one or more elements may form shapes, which may comprise one or more subshapes, which themselves may comprise one or more elements. Note that in descriptions herein, references to elements may also refer to complex elements and/or shapes included in the drawing specification.

An order of the elements may be automatically determined according to a sorting algorithm. Similar to above, the automatic determination may be performed by one or more graphical and/or text-based programs which may be executing on a host computer locally or remotely. Note that the sorting algorithm may ignore the order in which the elements were originally drawn or drafted, and instead, may place the elements in an order such that the tracing path (i.e., the path connecting and outlining the elements in the drawing specification) is optimized, i.e., such that the path is efficient. For example, the sorting algorithm may decrease the total length of the path by minimizing the path length between adjacent elements in the order.

In some embodiments, the sorting algorithm may include a radial sorting algorithm. In one embodiment, the radial sorting algorithm may prioritize each of the elements in the drawing specification according to each element's position relative to the geometric center of the drawing specification. Additionally, the radial sorting algorithm may also prioritize elements according to nesting, e.g., nesting depth and nesting order. For example, the radial sorting algorithm may prioritize those elements nested within other elements before other un-nested elements, i.e., the sorting algorithm may prioritize according to nesting order. The radial sorting algorithm may also prioritize elements according to nesting depth. For example, if an element contains a first element that also contains a second element, the sorting algorithm may prioritize that element over another element that only contains a first element.

In some embodiments, a user may have specified constraints on the order of the elements, as indicated above. In such cases, the sorting algorithm may automatically determine the order based on the one or more specified constraints.

Code for implementing motion control may be automatically generated based on the identification of the elements and the determined order for the elements. In some embodiments, the motion control operations specified by the motion control code may be implemented via a motion control device. Similar to above, the automatic generation may be performed by one or more graphical and/or text-based programs which may be executing on a host computer locally or remotely.

In one embodiment, the motion control code may include or specify various operations usable by the machine control device, such as (moving in an) arc, line, or contour, raise, lower, halt, begin, etc. In some embodiments, the motion control device may be a machining device that may draw, trace, etch, and/or cut various materials. The materials may include, for example, one or more of metal, wood, paper, polymer(s), chemical compound(s), and chemical element(s), among others.

In some embodiments, the generated code may include one or more automatically generated inserted operations. For example, in motion control for machining operations, e.g., etching shapes in materials, the automatically generated code may include raise, move, and lower operations, among others. In some embodiments, the user may, e.g., via the GUI, enable or disable the raise and lower operations, and additionally, may specify the tool-depth, i.e., the height of the raise and lower operations (if they are enabled).

Note that the sorting algorithm described above, in creating an optimized path, may decrease the path length of the inserted move operations. In other words, the sorting algorithm may minimize both the number of inserted move operations as well as the length of the move operations. Thus, the generated code may allow a motion control device to efficiently operate in accordance with the drawing specification.

In some embodiments, the generated code may include one or more of executable code, interpretable code, and scripting code. In some embodiments, the GUI may provide the user with several options, allowing the user to choose among several types of code and/or programs that may be programmatically, i.e., automatically, generated by the program executing on the computer system.

The GUI may also display a visual representation of the generated code to the user via the display of the computer system. In some embodiments, the user may be able to choose viewing preferences in the GUI such that the inserted moves may or may not be displayed. Note that the user's viewing preferences are not limited to inserted moves, and in fact, other viewing preferences are envisioned, such as window size, window placement, colors, and text fonts and sizes, among others.

In some embodiments, user input received to the GUI may invoke one or more of the automatic identification, the automatic determination of the order of elements, and the automatic generation of code.

In some embodiments, the method may also allow the user to further specify modification to the generated code. In some embodiments, the user may specify the modification in various forms, e.g., via the GUI. The modification may include modifying existing portions of the generated code, e.g., machine tool operations, elements, raise and lower dimensions, etc., and/or adding new portions to the generated code, e.g., adding new elements, machine operations, or other suitable portions of code to the generated code. In some embodiments, the generated code may be displayed in a text format, e.g., the GUI may show the generated code itself, such as code generated in C. In this case, the user may change the generated code directly, e.g., via a keyboard coupled to the computer system.

In some embodiments, the generated code may be displayed in a graphical format. For example, the GUI may have graphical representations of the code that may be modified graphically, e.g., using a mouse. For instance, the user may change the order of the shapes by double-clicking one of the elements and entering a new placement in the order for the element. In some embodiments, the user may change the order, the machine move lines, or other suitable properties of the generated code by dragging and dropping the lines or the elements displayed in the GUI (e.g., in the visual representation of the generated code).

In embodiments where the generated code includes a graphical program, the graphical program may be edited in a graphical programming environment, such as LabVIEW. The graphical program may include a plurality of interconnected nodes that visually indicate the functionality of the graphical program. Thus, the generated code may be modified via various methods; however, it should be noted that embodiments of the present invention are not limited to the modification methods enumerated above, and that other methods are envisioned.

After receiving input specifying these modifications to the generated code, the method may also include automatically modifying the generated code based on the modifications specified by the user. The modified code may subsequently be modified and generated according to further user input and/or implemented for motion control as indicated above, e.g., in an iterative manner.

Thus, in various embodiments of the present invention, code implementing motion control may be automatically generated based on a drawing specification.

BRIEF DESCRIPTION OF THE DRAWINGS

A better understanding of the present invention can be obtained when the following detailed description of the preferred embodiment is considered in conjunction with the following drawings, in which.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Incorporation by Reference

The following references are hereby incorporated by reference in their entirety as though fully and completely set forth herein:

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

Terms

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as signals such as electrical, electromagnetic, or digital signals, conveyed via a communication medium such as a bus, network and/or a wireless link.

Programmable Hardware Element—includes various types of programmable hardware, reconfigurable hardware, programmable logic, or field-programmable devices (FPDs), such as one or more FPGAs (Field Programmable Gate Arrays), or one or more PLDs (Programmable Logic Devices), such as one or more Simple PLDs (SPLDs) or one or more Complex PLDs (CPLDs), or other types of programmable hardware. A programmable hardware element may also be referred to as "reconfigurable logic".

Medium—includes one or more of a memory medium, carrier medium, and/or programmable hardware element; encompasses various types of mediums that can either store program instructions/data structures or can be configured with a hardware configuration program. For example, a medium that is "configured to perform a function or implement a software object" may be 1) a memory medium or carrier medium that stores program instructions, such that the program instructions are executable by a processor to perform the function or implement the software object; 2) a medium carrying signals that are involved with performing the function or implementing the software object; and/or 3) a programmable hardware element configured with a hardware configuration program to perform the function or implement the software object.

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, Pascal, Fortran, Cobol, Java, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element.

Graphical Program—A program comprising a plurality of interconnected nodes or icons, wherein the plurality of interconnected nodes or icons visually indicate functionality of the program.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW, DasyLab, DiaDem and Matrixx/SystemBuild from National Instruments, Simulink from the MathWorks, VEE from Agilent, WiT from Coreco, Vision Program Manager from PPT Vision, SoftWIRE from Measurement Computing, Sanscript from Northwoods Software, Khoros from Khoral Research, SnapMaster from HEM Data, VisSim from Visual Solutions, ObjectBench by SES (Scientific and Engineering Software), and VisiDAQ from Advantech, among others.

The term "graphical program" includes models or block diagrams created in graphical modeling environments, wherein the model or block diagram comprises interconnected nodes or icons that visually indicate operation of the model or block diagram; exemplary graphical modeling environments include Simulink, SystemBuild, VisSim, Hypersignal Block Diagram, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected nodes are often referred to as the block diagram portion of the graphical program.

Node—In the context of a graphical program, an element that may be included in a graphical program. A node may have an associated icon that represents the node in the graphical program, as well as underlying code or data that implements functionality of the node. Exemplary nodes include function nodes, terminal nodes, structure nodes, etc. Nodes may be connected together in a graphical program by connection icons or wires.

Data Flow Graphical Program (or Data Flow Diagram)—A graphical program or diagram comprising a plurality of interconnected nodes, wherein the connections between the nodes indicate that data produced by one node is used by another node.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators Input Control—a graphical user interface element for providing user input to a program. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are operable to acquire and/or store data. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, i.e., may receive and analyze data, and issue automation control signals in response.

Figure 1A:
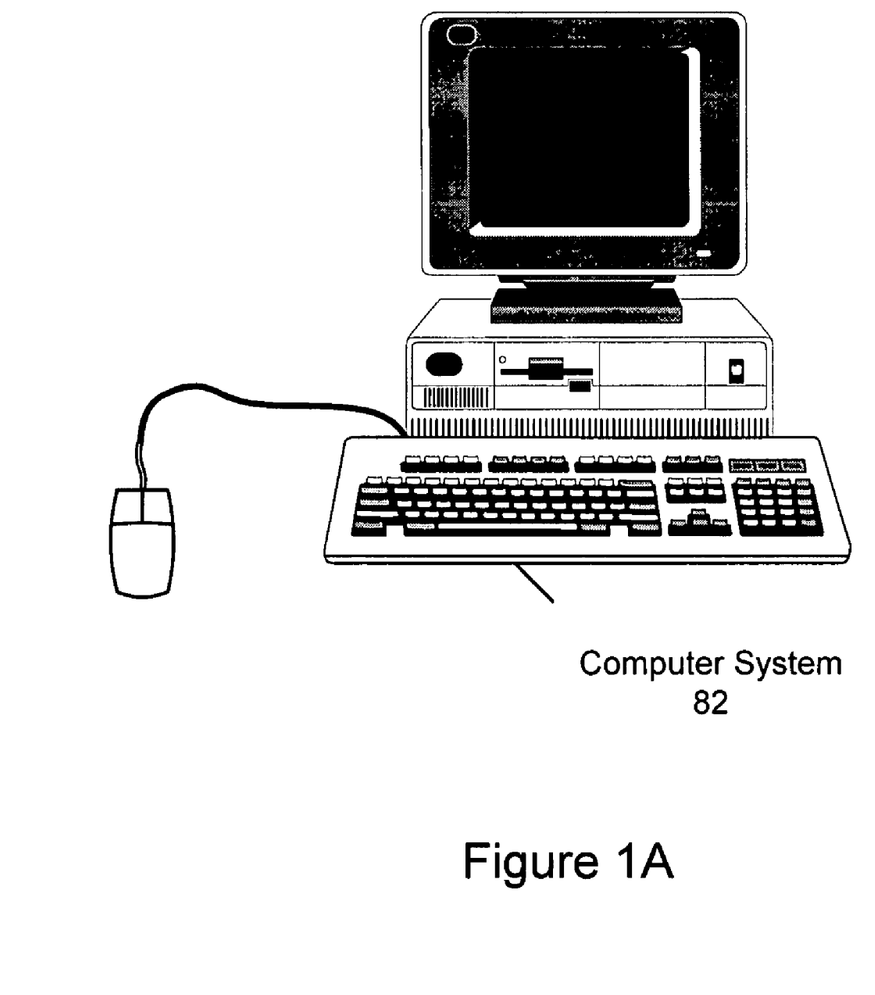
FIG. 1A illustrates a computer system, according to one embodiment of the present invention.

FIG. 1A—Computer System

FIG. 1A illustrates a computer system 82, according to one embodiment of the present invention.

As shown in FIG. 1A, the computer system 82 may include a display device operable to display a program which may implement various embodiments of the present invention. The display device may also be operable to display a graphical user interface or front panel of the program during execution of the program. The graphical user interface may comprise any type of graphical user interface, e.g., depending on the computing platform. In some embodiments, the program executing on the computer system 82 may be a graphical program.

The computer system 82 may include a memory medium(s) on which one or more computer programs or software components according to one embodiment of the present invention may be stored. For example, the memory medium may store one or more programs that are executable to perform the methods described herein. Additionally, the memory medium may store a programming development environment application, e.g., a graphical programming development environment application used to create and/or execute graphical programs. The memory medium may also store operating system software, as well as other software for operation of the computer system. Various embodiments further include receiving or storing instructions and/or data implemented in accordance with the foregoing description upon a carrier medium.

Figure 1B:
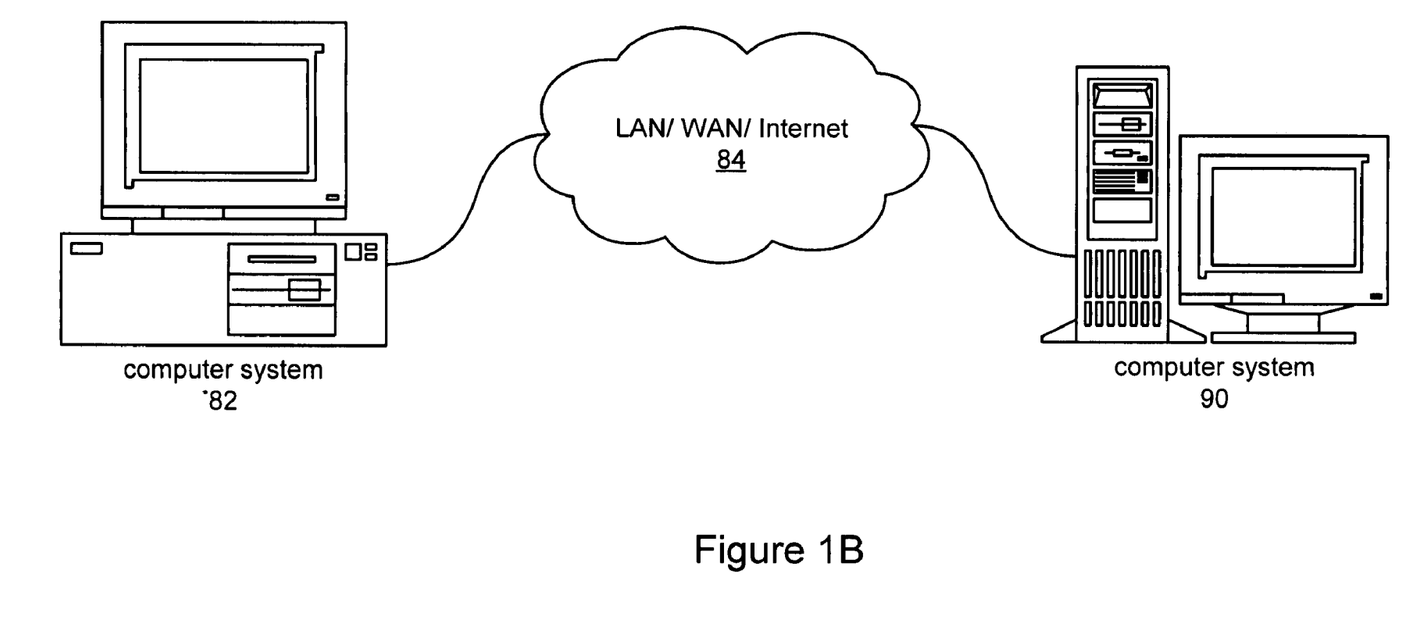
FIG. 1B illustrates a network system comprising two or more computer systems that may implement one embodiment of the present invention.

FIG. 1B—Computer Network

FIG. 1B illustrates a system including a first computer system 82 which is coupled to a second computer system 90. The computer system 82 may be connected through a network 84 (or a computer bus) to the second computer system 90. The computer systems 82 and 90 may each be any of various types, as desired. The network 84 may also be any of various types, including a LAN (local area network), WAN (wide area network), the Internet, or an Intranet, among others.

In some embodiments, the computer systems 82 and 90 may execute a graphical program in a distributed fashion. For example, computer 82 may execute a first portion of the block diagram of a graphical program and computer system 90 may execute a second portion of the block diagram of the graphical program. As another example, computer 82 may display the graphical user interface of a graphical program and computer system 90 may execute the block diagram of the graphical program.

In one embodiment, the graphical user interface of the graphical program may be displayed on a display device of the computer system 82, and the block diagram may execute on a device, e.g., a motion control device, connected to the computer system 82. The device may include a programmable hardware element and/or may include a processor and memory medium which may execute a real time operating system. In one embodiment, the graphical program may be downloaded and executed on the device. For example, an application development environment with which the graphical program is associated may provide support for downloading a graphical program for execution on the device in a real time system.

Exemplary Systems

Embodiments of the present invention may be involved with performing test and/or measurement functions; controlling and/or modeling instrumentation or industrial automation hardware; modeling and simulation functions, e.g., modeling or simulating a device or product being developed or tested, etc. Embodiments of the present invention may have specific applications in fields related to motion control. For example, the systems and methods herein may be applicable to motion control apparatus used for cutting, etching, tracing, and drawing on raw materials, such as wood, silicon (e.g., for electronic circuits), metal, paper, polymer, chemical compounds, chemical elements, etc.

However, it is noted that the present invention can be used for a plethora of applications and is not limited to the above applications. In other words, applications discussed in the present description are exemplary only, and the present invention may be used in any of various types of systems.

Figure 2A:
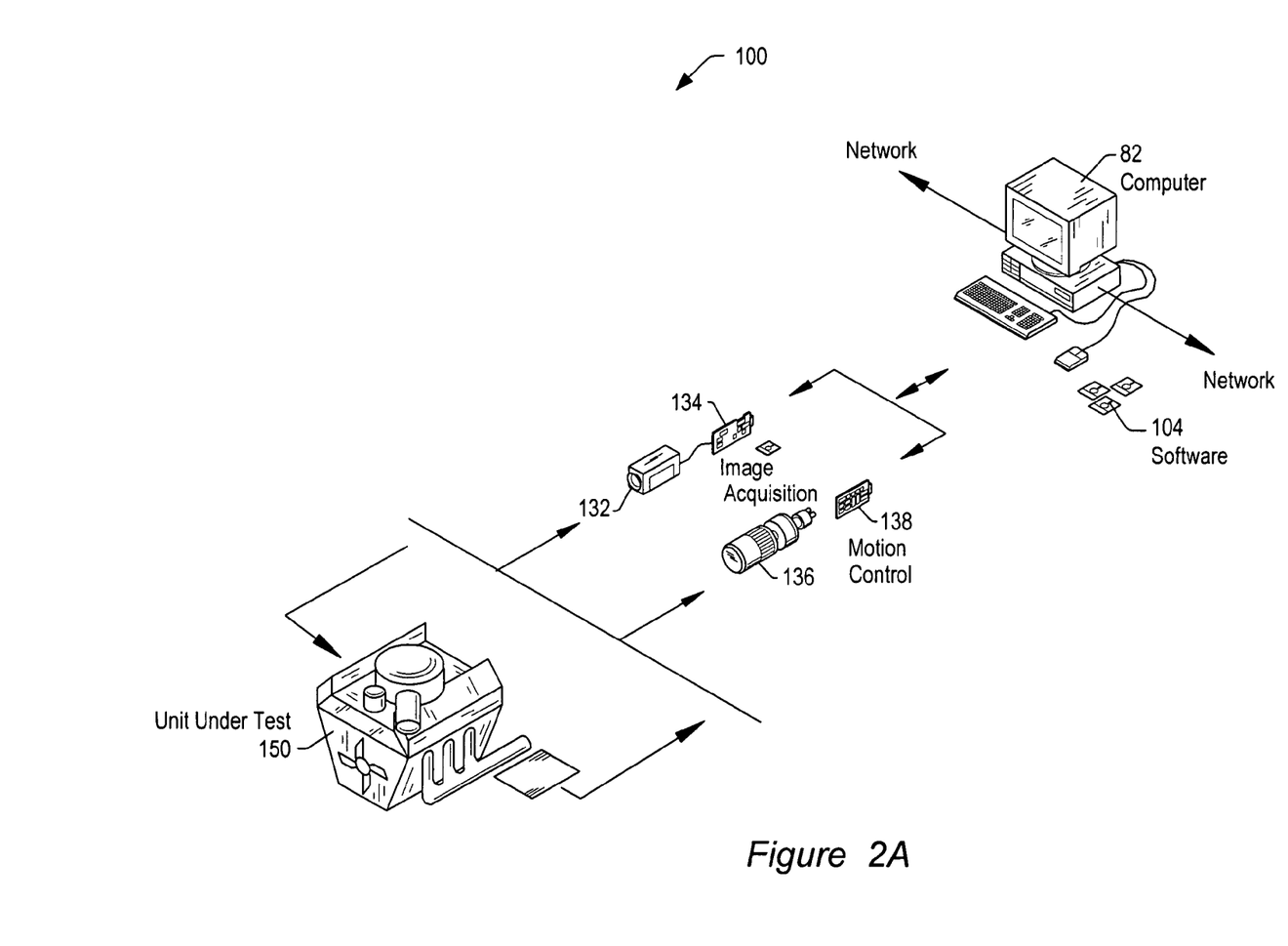
FIG. 2A illustrates an instrumentation control system, according to one embodiment of the invention.

FIG. 2A illustrates an exemplary instrumentation control system 100 which may implement various embodiments of the present invention. The system 100 includes a host computer 82 which connects to one or more instruments. The host computer 82 may include a CPU, a display screen, memory, and one or more input devices such as a mouse or keyboard as shown. The computer 82 may operate with the one or more instruments to analyze, measure, or control a unit under test (UUT) or process 150.

The one or more instruments may include an image acquisition device 132 and associated image acquisition interface card 134, a motion control device 136 and associated motion control interface card 138, or other suitable devices with associated interface cards. The computer system may couple to and operate with one or more of these instruments. The instruments may be coupled to a unit under test (UUT) or process 150, or may be coupled to receive field signals, typically generated by transducers. The system 100 may be used in a data acquisition and control application, in a test and measurement application, a process control application, a man-machine interface application, or a simulation application.

Figure 2B:
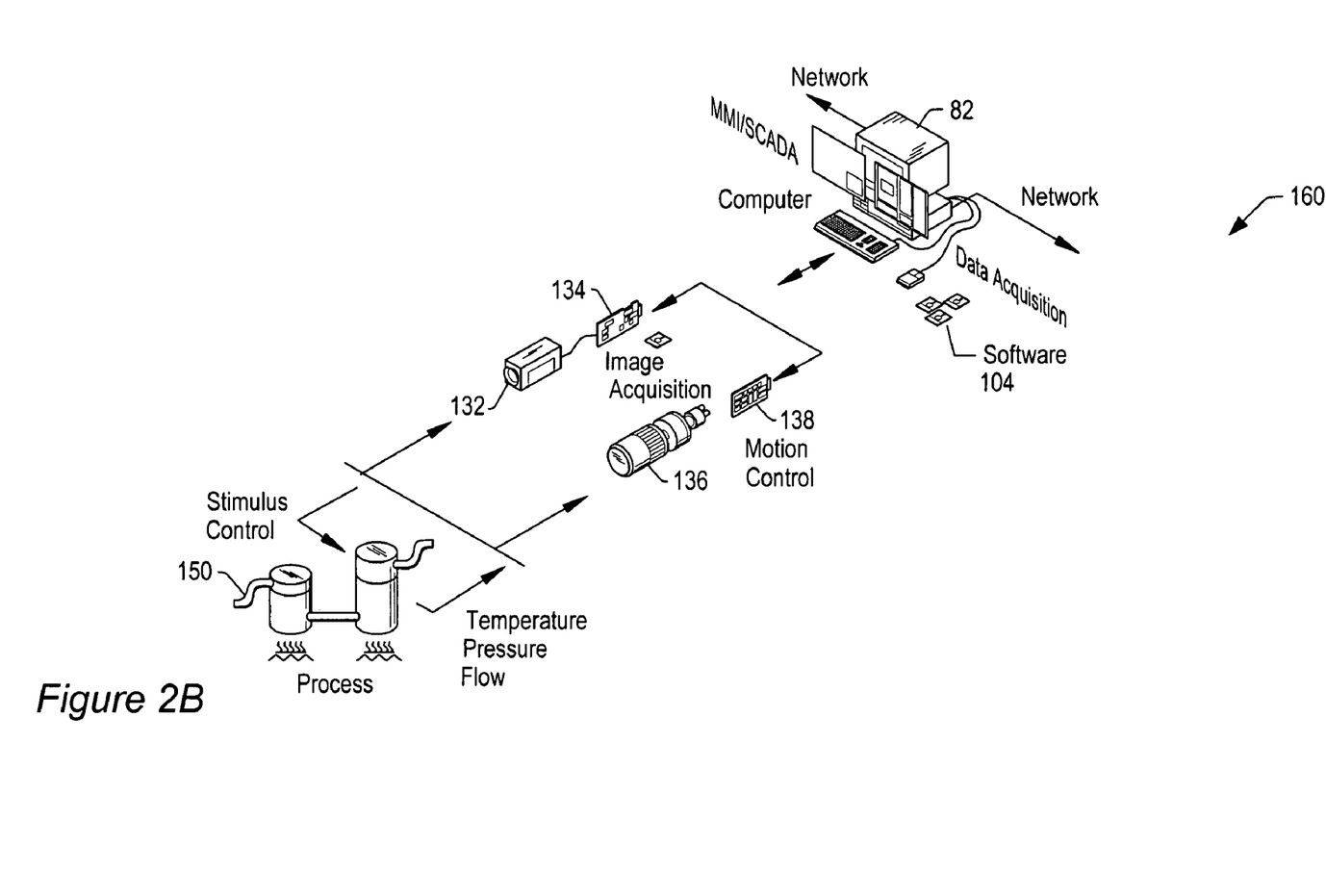
FIG. 2B illustrates an automation system, according to one embodiment of the invention.

FIG. 2B illustrates an exemplary automation system 160 which may implement embodiments of the invention. The automation system 160 is similar to the instrumentation or test and measurement system 100 shown in FIG. 2A. Elements which are similar or identical to elements in FIG. 2A have the same reference numerals for convenience. The system 160 may comprise a computer 82 which connects to one or more devices or instruments. The computer 82 may comprise a CPU, a display screen, memory, and one or more input devices such as a mouse or keyboard as shown. The computer 82 may operate with the one or more devices to a process or device 150 to perform an automation function, such as MMI (Man Machine Interface), process control, advanced analysis, or other control, among others.

The one or more devices may include an image acquisition device 132 and associated image acquisition card 134, a motion control device 136 and associated motion control interface card 138, among other types of devices.

In the embodiments of FIGS. 2A and 2B above, one or more of the various devices may couple to each other over a network, such as the Internet. In one embodiment, the user operates to select a target device from a plurality of possible target devices for programming or configuration using a program. Thus, the user may use (execute) the program on that computer or deploy the program to a target device (for remote execution on the target device) that is remotely located from the computer and coupled to the computer through a network.

In some embodiments, the program may be a graphical program. It should be noted that graphical software programs which perform data acquisition, analysis and/or presentation, e.g., for measurement, instrumentation control, industrial automation, modeling, or simulation, such as in the applications shown in FIGS. 2A and 2B, may be referred to as virtual instruments.

Figure 3:
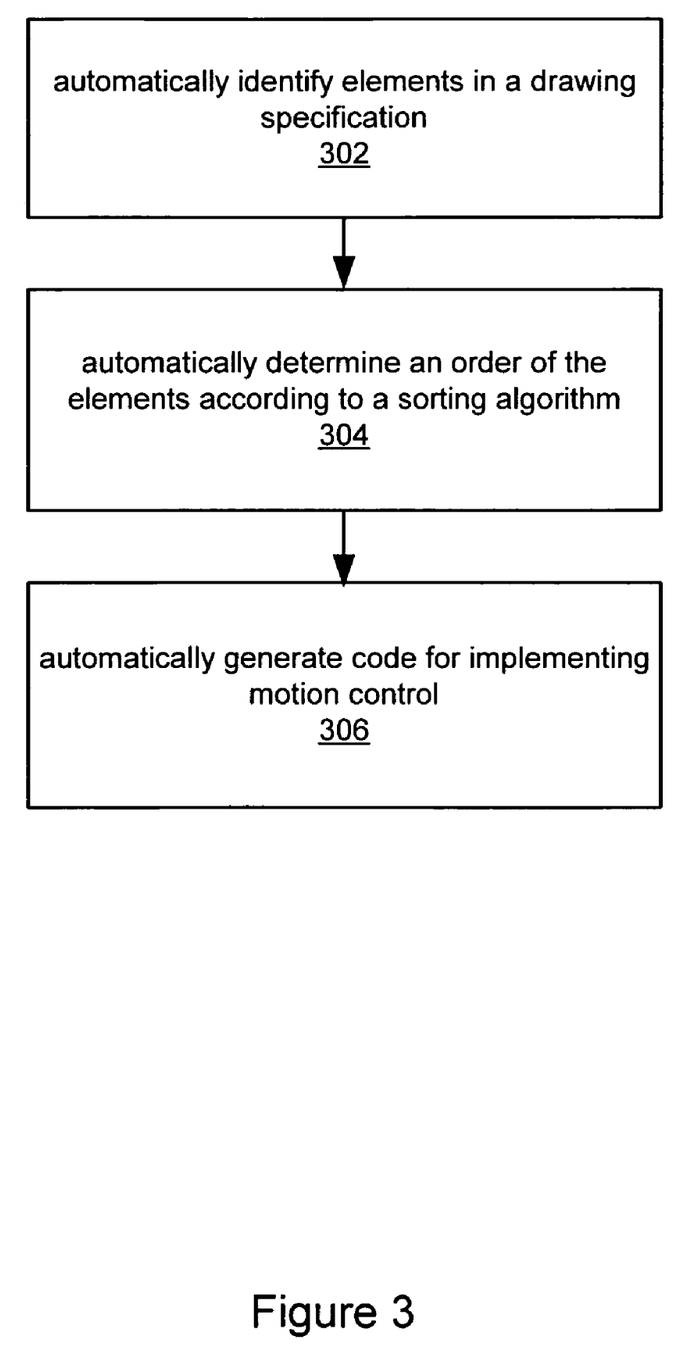
FIG. 3 is a flowchart diagram illustrating a method for utilizing drawing specifications for motion control, according to one embodiment of the present invention.

FIG. 3—Method for Utilizing Drawings for Motion Control

FIG. 3 illustrates a method for utilizing drawing specifications for motion control. The method shown in FIG. 3 may be used in conjunction with any of the computer systems or devices shown in the above Figures, among other devices. In various embodiments, some of the method elements shown may be performed concurrently, in a different order than shown, or may be omitted. Additional method elements may also be performed as desired. As shown, this method may operate as follows.

In 302, a plurality of elements in a drawing specification (possibly comprising multiple drawing specifications) may be automatically identified. Additionally, the drawing specification may include or be included in one or more digital files, e.g., one or more AutoCAD digital drafting files. The file may be present on a computer system, e.g., the computer system 82, or may be accessed or downloaded from another computer system, e.g., the computer system 90, via a network, e.g., the network 84. The drawing specification may also include one or more drawings. In some embodiments, an image acquisition device, e.g., the image acquisition device 132 and associated image acquisition card 134, a scanner, a digital camera, or other appropriate device(s), may obtain an image of the drawing(s), which in turn may be analyzed on or by the computer system.

In preferred embodiments, the plurality of elements of the drawing specification may be automatically identified by a program executing on the computer system. In some embodiments, the program executing on the computer system may include one or more text-based programs and/or one or more graphical programs, such as, for example, those implemented in or by the LabVIEW graphical program development environment provided by National Instruments Corporation. Additionally, the program may include a graphical user interface (GUI) executing on the computer system or the other computer system, e.g., the computer system 90, coupled to the computer system. The user may also specify one or more constraints on one or more of the elements included in the drawing specification. For example, the user may specify the placement or order of one or more of the elements, e.g., the user may specify that a certain element be placed first in the order, as described in more detail below.

In some embodiments, the elements may include any of numerous shapes and lines specified or included in the drawing specification. For example, the drawing specification may include one or more lines, polygons, arcs, splines, alphanumeric characters with one or more associated fonts, ellipses, and/or clouds, among others. Note that embodiments where the drawing specification includes one or more AutoCAD digital drafting files, the elements may include entities found in a DXF file (e.g., the AutoCAD digital drafting file), although other drafting file formats are also contemplated.

Figure 4A:
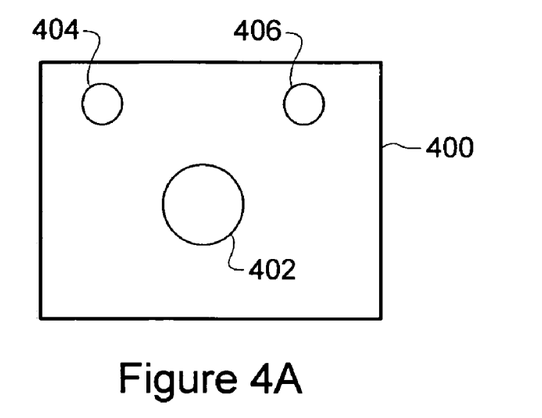
FIGS. 4A-4B and 5A-5B illustrate exemplary drawing specifications and respective solutions, according to some embodiments of the invention.
Figure 4B:
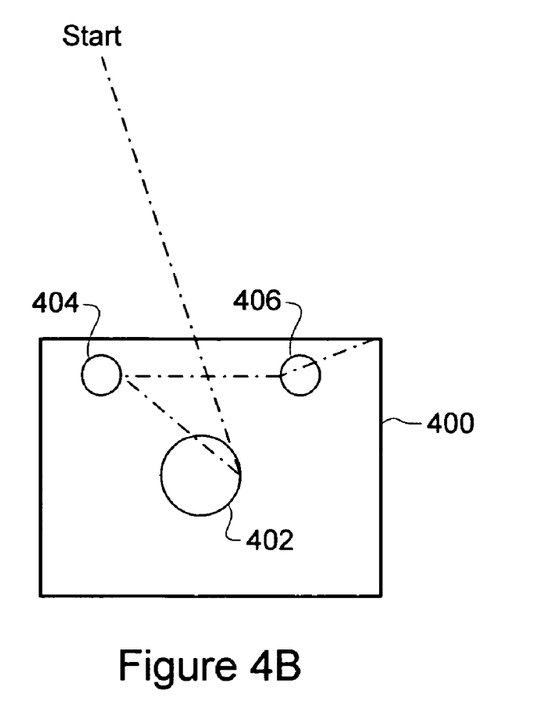
Figure 5A:
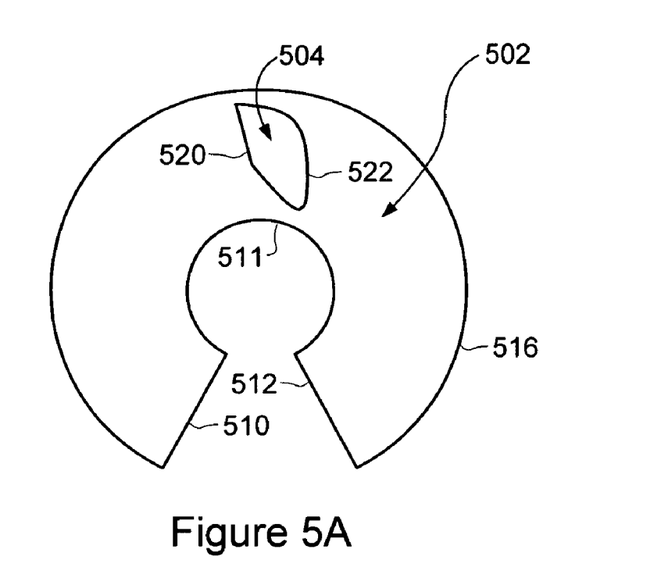
Figure 5B:
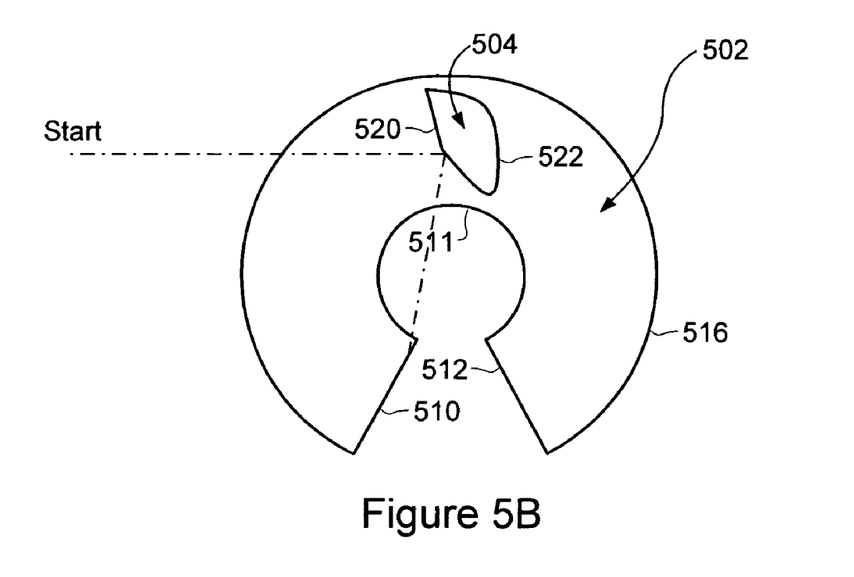

In some embodiments, elements may be nested, i.e., located within one or more other elements in the drawing specification. For example, in FIGS. 4A-4B, elements 402, 404, and 406 are nested within element 400. Each of these elements, and combinations thereof, may be automatically identified, e.g., via the program executing on the computer system. In some embodiments, complex elements may include one or more elements in the drawing specification and may be automatically identified. In some embodiments, as indicated above, one or more elements may form shapes. For example, a series of connected lines and arcs, or other equivalent elements (and/or complex elements), may form a shape, such as, for example, a crescent moon, and may be automatically identified as such. In some embodiments, the shapes may comprise one or more subshapes, which themselves may comprise one or more elements. As a further example, FIGS. 5A-5B illustrate two complex elements, e.g., shapes 502 and 504. In one embodiment, elements 510, 512, 511, and 516 may be automatically identified as complex element (or shape) 502, e.g., via the program. Similarly, complex element (or shape) 504 may be automatically identified as including the elements 520 and 522. Note that in descriptions herein, references to elements may also refer to complex elements included in the drawing specification.

In 304, an order of the elements may be automatically determined according to a sorting algorithm. Similar to above, the automatic determination may be performed by one or more graphical and/or text-based programs which may be executing on a host computer locally or remotely. Note that the sorting algorithm may ignore the order in which the elements were originally drawn or drafted, and instead, may place the elements in an order such that the tracing path (i.e., the path connecting and outlining the elements in the drawing specification) is optimized, i.e., such that the path is efficient. For example, the sorting algorithm may decrease the total length of the path by minimizing the path length between adjacent elements in the order. Said another way, the sorting algorithm may minimize the distance between the first and second elements, the second and third elements, etc., such that the whole path is minimized.

In some embodiments, the sorting algorithm may include a geometric sorting algorithm. For example, the sorting algorithm may prioritize the elements in the drawing specification based on the geometries of the elements and of the complex elements made thereof.

In some embodiments, the sorting algorithm may include a radial sorting algorithm. In one embodiment, the radial sorting algorithm may prioritize each of the elements in the drawing specification according to each element's position relative to the geometric center of the drawing specification. For example, as illustrated in FIGS. 4A-4B, element 402, the element closest to the geometric center of the drawing specification, may be sorted first, followed by elements 406, 404, and 400. Additionally, the radial sorting algorithm may also prioritize elements according to nesting, e.g., nesting depth and nesting order. For example, the radial sorting algorithm may prioritize those elements nested within other elements before other un-nested elements, i.e., the sorting algorithm may prioritize according to nesting order. More specifically, in the example illustrated in FIGS. 5A-5B, complex element 504, which includes elements 520 and 522, may be prioritized before complex element 502, the element closest to the center, which includes elements 510, 511, 512, and 516, because complex element 504 is nested within complex element 502. The radial sorting algorithm may also prioritize elements according to nesting depth. For example, if an element contains a first element that also contains a second element, the sorting algorithm may prioritize that element over another element that only contains a first element.

Figure 6A:
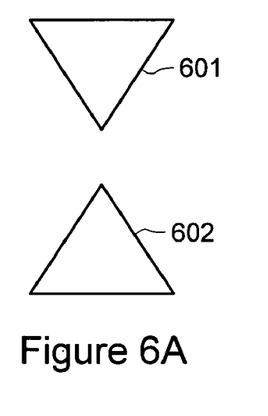
FIGS. 6A-6C illustrate an exemplary drawing specification and two solutions, according to one embodiment of the invention.
Figure 6B:
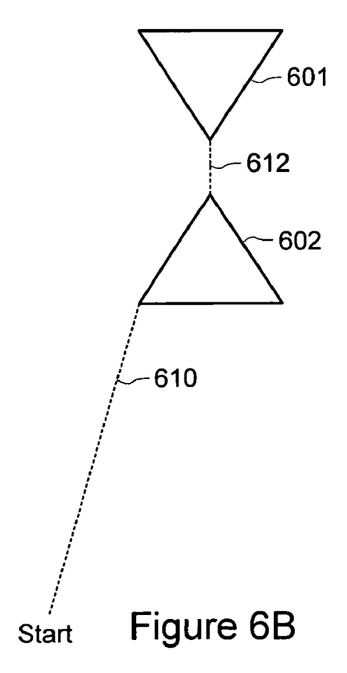
Figure 6C:
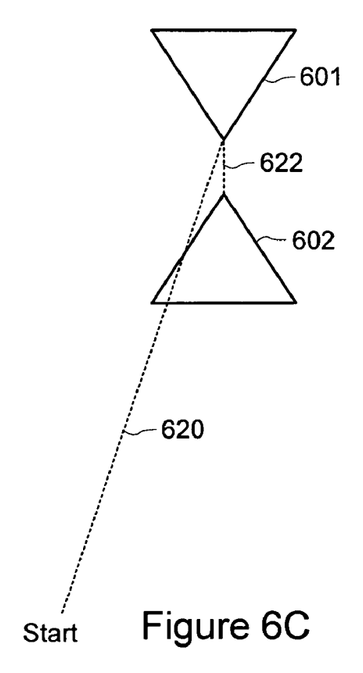

In some embodiments, a user may have specified constraints on the order of the elements, as indicated above. In such cases, the sorting algorithm may automatically determine the order based on the one or more specified constraints. FIGS. 6A-6C illustrate such an example. FIG. 6A illustrates a drawing specification; FIG. 6B illustrates a default solution of the drawing specification illustrated in FIG. 6A; however, element 601 may be sorted first due to specified constraints, e.g., from the user. The sorting algorithm may then determine the rest of the order based on the sorting algorithm, resulting in the solution illustrated in FIG. 6C. Thus, the tracing path, instead of following the path of FIG. 6B, i.e., following dashed-line 610, outlining element 602, following dashed-line 612, and outlining 601, follows the path of FIG. 6C, i.e., following dashed-line 620, outlining 601, following dashed-line 622, and outlining 602. Thus, the sorting algorithm may prioritize elements according to specified constraints.

In 306, code for implementing motion control may be automatically generated based on the identification of the elements and the determined order for the elements. In some embodiments, the motion control operations specified by the motion control code may be implemented via a motion control device. Similar to above, the automatic generation may be performed by one or more graphical and/or text-based programs which may be executing on a host computer locally or remotely.

In one embodiment, the motion control code may include or specify various operations usable by the machine control device, such as (moving in an) arc, line, or contour, raise, lower, halt, begin, etc. In some embodiments, the motion control device may be a machining device that may draw, trace, etch, and/or cut various materials. The materials may include, for example, one or more of metal, wood, paper, polymer(s), chemical compound(s), and chemical element(s), among others.

In some embodiments, the generated code may include one or more automatically generated inserted operations. For example, in motion control for machining operations, e.g., etching shapes in materials, the automatically generated code may include raise, move, and lower operations, among others. In some embodiments, the user may, e.g., via the GUI, enable or disable the raise and lower operations, and additionally, may specify the tool-depth, i.e., the height of the raise and lower operations (if they are enabled). Such inserted operations may allow the material to be cut, etched, traced, etc., in a way such that the now etched, or equivalently modified, material's design resembles the drawing specification. Said another way, because the generated code includes raise and lower operations, moving the tool between different elements may not result in the materials being cut, etched, traced, or otherwise modified undesirably.

Note that the sorting algorithm described above, in creating an optimized path, may decrease the path length of the inserted move operations. In other words, the sorting algorithm may minimize both the number of inserted move operations as well as the length of the move operations. Thus, the generated code may allow a motion control device to efficiently operate in accordance with the drawing specification.

In some embodiments, the generated code may include one or more of executable code, interpretable code, and scripting code. For example, the generated code may be operable to be implemented directly onto a motion control device, or a controller for the motion control device, that accepts code in the C programming language. In these cases, the code may be automatically generated as C code. Similarly, the motion control device may accept code in a scripting language; in this case, the code may be automatically generated as a script executable by the motion control device. In some embodiments, the code may include or be used to generate API calls for the motion control device. The generated code may include one or more graphical programs and/or text-based programs. In one embodiment, the generated code may include pseudo code that may be automatically documented and easily understood. In some embodiments, the GUI may provide the user with several options, allowing the user to choose among several types of code and/or programs that may be programmatically, i.e., automatically, generated by the program executing on the computer system.

The GUI may also display a visual representation of the generated code to the user via the display of the computer system. In some embodiments, the user may be able to choose viewing preferences in the GUI such that the inserted moves may or may not be displayed. For example, as illustrated in FIGS. 4A-4B, 5A-5B, and 6A-6C, the GUI may display the dotted lines illustrating the inserted move operations (as well as other inserted operations, e.g., raise and lower operations) according to the user's viewing preferences. Note that the user's viewing preferences are not limited to inserted moves, and in fact, other viewing preferences are envisioned, such as window size, window placement, colors, and text fonts and sizes, among others.

In some embodiments, user input received to the GUI may invoke one or more of the automatic identification (302), the automatic determination of the order of elements (304), and the automatic generation of code (306).

In some embodiments, the method may also allow the user to further specify modification to the generated code. In some embodiments, the user may specify the modification in various forms, e.g., via the GUI. The modification may include modifying existing portions of the generated code, e.g., machine tool operations, elements, raise and lower dimensions, etc., and/or adding new portions to the generated code, e.g., adding new elements, machine operations, or other suitable portions of code to the generated code. In some embodiments, the generated code may be displayed in a text format, e.g., the GUI may show the generated code itself, such as code generated in C. In this case, the user may change the generated code directly, e.g., via a keyboard coupled to the computer system.

In some embodiments, the generated code may be displayed in a graphical format. For example, the GUI may have graphical representations of the code (such as those illustrated in FIGS. 4A-4B, 5A-5B, and 6A-6C) that may be modified graphically, e.g., using a mouse. For instance, the user may change the order of the shapes by double-clicking one of the elements and entering a new placement in the order for the element. In some embodiments, the user may change the order, the machine move lines (e.g., the dotted lines illustrated in FIGS. 4A-4B, 5A-5B, and 6A-6C), or other suitable properties of the generated code by dragging and dropping the lines or the elements displayed in the GUI (e.g., the visual representation of the generated code).

In embodiments where the generated code includes a graphical program, the graphical program may be edited in a graphical programming environment, such as LabVIEW. The graphical program may include a plurality of interconnected nodes that visually indicate the functionality of the graphical program. Thus, the generated code may be modified via various methods; however, it should be noted that embodiments of the present invention are not limited to the modification methods enumerated above, and that other methods are envisioned.

After receiving input specifying these modifications to the generated code, the method may also include automatically modifying the generated code based on the modifications specified by the user. The modified code may subsequently be modified and generated according to further user input and/or implemented for motion control as indicated above, e.g., in an iterative manner.

As indicated above, FIGS. 4A and 4B illustrate an example of a drawing specification (4A) as well as a resulting motion path (4B) for a motion control device. In this case, the radial sorting algorithm prioritizes elements 402, 404, and 406 before element 400. Such sorting may provide benefits over and beyond other sorting methods. For example, in cases where the motion control device cuts the elements of FIGS. 4A and 4B out of a material, e.g., sheet metal, if element 400 is cut first, the sheet metal may fall off of the assembly line before elements 402, 404, and 406 may be cut. Thus, with radial sorting, all of the elements may be cut successfully, e.g., from the inside outward.

Similarly, as indicated above with regard to FIGS. 5A and 5B, complex element 504 may be preferentially cut before complex element 502 (5B) because of nesting order. Thus, the method may cut the drawing specification of FIG. 5B via inserting a tool movement to complex element 504, cutting complex element 504, inserting a raise, move, and lower operation to complex element 502, and cutting complex element 502.

As described above regarding FIGS. 6A-6C, a user may specify constraints such that element 601 is cut before 602. Thus, an automatically generated solution without constraints (6B) may cut 602 before 601; however, by adding the constraint that 601 has first priority, the method may automatically generate a different solution (6C) with a different order, e.g., element 601 before element 602, and different inserted moves.

Thus, in various embodiments of the present invention, code implementing motion control may be automatically generated based on a drawing specification.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A method for utilizing drawing specifications for use in motion control, comprising:
   automatically identifying a plurality of elements in a drawing specification;
   automatically determining an order of the plurality of elements according to a sorting algorithm, wherein the sorting algorithm comprises a radial sorting algorithm; and
   automatically generating code for implementing motion control based on said identifying the plurality of elements and said determining the order.

2. The method of claim 1,
   wherein the drawing specification comprises one or more drawing specifications.

3. The method of claim 1,
   wherein the drawing specification comprises one or more digital files.

4. The method of claim 1,
   wherein the drawing specification comprises one or more AutoCAD digital drafting files.

5. The method of claim 1,
   wherein the drawing specification comprises one or more drawings.

6. The method of claim 1,
   wherein the sorting algorithm comprises a geometric sorting algorithm.

7. The method of claim 1,
   wherein the radial sorting algorithm specifies the order of elements of the plurality of elements based on respective distances from a geometric center of the drawing specification for the plurality of elements.

8. The method of claim 1,
   wherein at least one subset of the plurality of elements comprises at least one nested subset, wherein the radial sorting algorithm specifies the order of elements of the plurality of elements based on one or more of:
   nesting order of the at least one nested subset, beginning with an innermost element of the at least one nested subset; or
   nesting depth of the at least one nested subset.

9. The method of claim 1,
   wherein said automatically generating code comprises:
   automatically inserting operations into the generated code.

10. The method of claim 9,
    wherein the inserted operations comprise one or more:
    raise operations;
    move operations; or
    lower operations.

11. The method of claim 1,
    wherein the generated code comprises instructions executable by a motion control device, wherein the motion control device is operable to perform one or more of:
    drawing on one or more materials;
    tracing one or more materials;
    etching one or more materials; or
    cutting one or more materials.

12. The method of claim 11,
    wherein the one or more materials comprise one or more of:
    metal;
    wood;
    paper;
    polymer;
    silicon;
    one or more chemical compounds; or
    one or more chemical elements.

13. The method of claim 1,
    wherein the plurality of elements comprise a plurality of:
    one or more lines;
    one or more polygons;
    one or more arcs;
    one or more splines;
    one or more alphanumeric characters in one or more associated fonts;
    one or more ellipses; or
    one or more clouds.

14. The method of claim 1,
    wherein the plurality of elements compose one or more shapes, wherein each shape of the one or more shapes comprises a subset of the plurality of elements.

15. The method of claim 1,
    wherein the plurality of elements compose one or more complex elements, wherein each complex element of the one or more complex elements comprises a subset of the plurality of elements.

16. The method of claim 1,
    wherein the generated code comprises one or more of:
    executable code;
    interpretable code; or
    scripting code.

17. The method of claim 1, wherein the generated code comprises one or more of:
    one or more graphical programs, wherein each of the one or more graphical programs comprises a plurality of interconnected nodes that visually indicate functionality of the graphical program; or
    one or more text-based programs.

18. The method of claim 1,
    wherein said automatically identifying the plurality of elements, said automatically determining the order, and said automatically generating code is performed by one or more of:
    one or more graphical programs, wherein each of the one or more graphical programs comprises a plurality of interconnected nodes that visually indicate functionality of the graphical program; or
    one or more text-based programs.

19. The method of claim 1, the method further comprising:
    displaying a visual representation of the generated code in a graphical user interface (GUI) displayed on a display device of a computer system.

20. The method of claim 1, the method further comprising:

receiving user input to a GUI invoking one or more of said automatically identifying the plurality of elements, said automatically determining the order, and said automatically generating code.

21. The method of claim 1, the method further comprising:
receiving user input to a GUI specifying a modification to the order; and
automatically modifying the generated code in accordance with the modified order.

22. The method of claim 1, the method further comprising:
receiving user input to a GUI specifying one or more constraints on the order of the plurality of elements;
wherein said automatically determining the order comprises automatically determining the order based on the one or more constraints.

23. The method of claim 1, the method further comprising:
receiving user input to a GUI specifying modification of the generated code; and
automatically modifying the generated code based on the user input.

24. The method of claim 1, the method further comprising:
automatically inserting operations into the generated code; and
receiving user input to a GUI displayed on a display device of a computer system, wherein the GUI indicates the inserted operations, and wherein the user input specifies enabling or disabling display of the inserted operations.

25. A system for utilizing drawing specifications for use in motion control, comprising:
a processor; and
a memory coupled to the processor, comprising instructions executable by the processor to implement:
automatically identifying a plurality of elements in a drawing specification;
automatically determining an order of the plurality of elements according to a sorting algorithm, wherein the sorting algorithm comprises a radial sorting algorithm; and
automatically generating code for implementing motion control based on said identifying the plurality of elements and said determining the order.

26. The system of claim 25, wherein the radial sorting algorithm specifies the order of elements of the plurality of elements based on respective distances from a geometric center of the drawing specification for the plurality of elements.

27. The system of claim 25, wherein at least one subset of the plurality of elements comprises at least one nested subset, wherein the radial sorting algorithm specifies the order of elements of the plurality of elements based on one or more of:
nesting order of the at least one nested subset, beginning with an innermost element of the at least one nested subset; or
nesting depth of the at least one nested subset.

28. The system of claim 25, wherein said automatically generating code comprises:
automatically inserting operations into the generated code.

29. The system of claim 25, wherein the instructions are farther executable to implement:
automatically inserting operations into the generated code; and
receiving user input to a GUI displayed on a display device of a computer system, wherein the GUI indicates the inserted operations, and wherein the user input specifies enabling or disabling display of the inserted operations.

30. The system of claim 25, wherein the instructions are farther executable to implement:
receiving user input to a GUI specifying a modification to the order; and
automatically modifying the generated code in accordance with the modified order.

31. The system of claim 25, wherein the instructions are farther executable to implement:
receiving user input to a GUI specifying one or more constraints on the order of the plurality of elements;
wherein said automatically determining the order comprises automatically determining the order based on the one or more constraints.

32. A computer-accessible memory medium for utilizing drawing specifications for use in motion control, comprising instructions executable by a processor to implement:
automatically identifying a plurality of elements in a drawing specification;
automatically determining an order of the plurality of elements according to a sorting algorithm, wherein the sorting algorithm comprises a radial sorting algorithm; and
automatically generating code for implementing motion control based on said identifying the plurality of elements and said determining the order.

33. The memory medium of claim 32, wherein the radial sorting algorithm specifies the order of elements of the plurality of elements based on respective distances from a geometric center of the drawing specification for the plurality of elements.

34. The memory medium of claim 32, wherein at least one subset of the plurality of elements comprises at least one nested subset, wherein the radial sorting algorithm specifies the order of elements of the plurality of elements based on one or more of:
nesting order of the at least one nested subset, beginning with an innermost element of the at least one nested subset; or
nesting depth of the at least one nested subset.

35. The memory medium of claim 32, wherein said automatically generating code comprises:
automatically inserting operations into the generated code.

36. The memory medium of claim 32, wherein the instructions are further executable to implement:
receiving user input to a GUI specifying a modification to the order; and automatically modifying the generated code in accordance with the modified order.

37. The memory medium of claim 32, wherein the instructions are further executable to implement:
receiving user input to a GUI specifying one or more constraints on the order of the plurality of elements;
wherein said automatically determining the order comprises automatically determining the order based on the one or more constraints.

38. The memory medium of claim 32, wherein the instructions are further executable to implement:
automatically inserting operations into the generated code; and receiving user input to a GUI displayed on a display device of a computer system, wherein the GUI indicates the inserted operations, and wherein the user input specifies enabling or disabling display of the inserted operations.

39. A system for utilizing drawing specifications for use in motion control, comprising:
- means for automatically identifying a plurality of elements in a drawing specification;
- means for automatically determining an order of the plurality of elements according to a sorting algorithm, wherein the sorting algorithm comprises a radial sorting algorithm; and
- means for automatically generating code for implementing motion control based on said identifying the plurality of elements and said determining the order.

40. The method of claim 28,
wherein the radial sorting algorithm specifies the order of elements of the plurality of elements based on respective distances from a geometric center of the drawing specification for the plurality of elements.

41. The memory medium of claim 39,
wherein at least one subset of the plurality of elements comprises at least one nested subset, wherein the radial sorting algorithm specifies the order of elements of the plurality of elements based on one or more of:
- nesting order of the at least one nested subset, beginning with an innermost element of the at least one nested subset; or
- nesting depth of the at least one nested subset.

* * * * *

UNITED STATES PATENT AND TRADEMARK OFFICE
CERTIFICATE OF CORRECTION

PATENT NO. : 7,369,917 B2
APPLICATION NO. : 11/334782
DATED : May 6, 2008
INVENTOR(S) : Ravish et al.

Page 1 of 1

It is certified that error appears in the above-identified patent and that said Letters Patent is hereby corrected as shown below:

Column 20
Line 1, please delete "The method of claim 28" and substitute -- The method of claim 39 --.

Signed and Sealed this

Fifteenth Day of July, 2008

JON W. DUDAS
*Director of the United States Patent and Trademark Office*